(12) United States Patent
Hori et al.

(10) Patent No.: US 7,697,588 B2
(45) Date of Patent: Apr. 13, 2010

(54) STRUCTURE HAVING PHOTONIC CRYSTAL AND SURFACE-EMITTING LASER USING THE SAME

(75) Inventors: Yuichiro Hori, Kawasaki (JP); Mitsuhiro Ikuta, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 11/933,642

(22) Filed: Nov. 1, 2007

(65) Prior Publication Data

US 2008/0107145 A1 May 8, 2008

(30) Foreign Application Priority Data

Nov. 2, 2006 (JP) .............................. 2006-298525
Sep. 18, 2007 (JP) .............................. 2007-240767

(51) Int. Cl.
*H01S 3/08* (2006.01)
(52) U.S. Cl. ...................... 372/99; 372/50.11; 385/129
(58) Field of Classification Search .................. 372/99, 372/50.11; 385/129
See application file for complete search history.

(56) References Cited

U.S. PATENT DOCUMENTS

| | | | | |
|---|---|---|---|---|
| 6,542,682 | B2 * | 4/2003 | Cotteverte et al. | 385/125 |
| 6,643,439 | B2 * | 11/2003 | Notomi et al. | 385/125 |
| 6,707,588 | B2 * | 3/2004 | Takada | 359/241 |
| 7,442,965 | B2 * | 10/2008 | Wierer et al. | 257/98 |
| 7,483,466 | B2 * | 1/2009 | Uchida et al. | 372/50.11 |
| 7,498,574 | B2 * | 3/2009 | Puscasu et al. | 250/336.1 |
| 7,535,946 | B2 * | 5/2009 | Nagatomo et al. | 372/50.124 |
| 2006/0104586 | A1 * | 5/2006 | Tokushima | 385/129 |
| 2007/0201526 | A1 | 8/2007 | Hori | 372/50.124 |
| 2007/0201527 | A1 | 8/2007 | Hori et al. | 372/50.124 |

OTHER PUBLICATIONS

RefractiveIndex.INFO, http://refractiveindex.info/index.php?group=CRYSTALS&material=AlGaAs.*
RefractiveIndex.IFO, http://refractiveindex.info/index.php?group=CRYSTALS&material=AlGaInP&option=0&wavelength=0.9919.*
Chunchen Lin, et al., "Experimentally Demonstrated Filters Based on Guided Resonance of Photonic-Crystal Films", Applied Physics Letters 87, 091102 (2005).
Zhi-Yuan Li, et al., "Light Propagation in Semi-Infinite Photonic Crystals and Related Waveguide Structures", Physical Review B 68, 155101 (2003).

* cited by examiner

*Primary Examiner*—Minsun Harvey
*Assistant Examiner*—Yuanda Zhang
(74) *Attorney, Agent, or Firm*—Fitzpatrick, Cella, Harper & Scinto (57) ABSTRACT

To provide a structure having a photonic crystal that can display a reflection function using GR even when a refractive index difference between a photonic crystal layer and a cladding layer adjacent thereto is not sufficient and a surface-emitting laser using the structure. The structure includes a photonic crystal layer including a first member of a flat shape and plural pillars arrayed two-dimensionally periodically on the first member. The photonic crystal layer is formed of a first material having a first refractive index. A low refractive index layer formed of a second material having a second refractive index lower than the first refractive index is adjacent to the photonic crystal layer. A relative refractive index difference between the first refractive index and the second refractive index is not less than 0.04 and does not exceed 0.13. The height of the pillars with respect to the thickness of the photonic crystal layer is not less than 0.10t and does not exceed 0.07t.

5 Claims, 6 Drawing Sheets

STRUCTURE HAVING PHOTONIC CRYSTAL AND SURFACE-EMITTING LASER USING THE SAME

BACKGROUND OF THE INVENTION

1. Field of the Invention

The present invention relates to a structure having a photonic crystal and a surface-emitting laser using the same.

2. Description of the Related Art

In recent years, researches concerning a photonic crystal have been actively performed. The photonic crystal is the structure in which, like a band gap present in an electronic state in a crystal, a wavelength band (a photonic band gap) for controlling light waveguide is generated by giving periodic structure to a refractive index.

It is known that incident light is diffracted in an in-plane direction of the photonic crystal and diffracted light of the incident light is combined with a radiation mode and transmitted or reflected.

Guided Resonance (GR) is a phenomenon in which light of a waveguide mode guided in the in-plane direction of the photonic crystal having the refractive index periodic structure in the in-plane direction is combined with the radiation mode to be radiated to the outside of the photonic crystal.

The photonic crystal can be used as a mirror by using the GR. When light made incident in a direction perpendicular to the in-plane of the photonic crystal is combined with a mode located above a light line, the light is converted into a mode for waveguide in the photonic crystal. Thereafter, when the light is combined with the radiation mode, the light is radiated to the outside of the photonic crystal again. An unusual reflection phenomenon, for example, reflection with efficiency of 100% is caused by interference between light that is directly reflected without being combined with the waveguide mode and light that is once combined with the waveguide mode and radiated to the outside again.

In general, the waveguide mode means a mode in which a condition that light does not leak from a photonic crystal layer is satisfied. The radiation mode means a mode in which light leaks from the photonic crystal layer.

The light line indicates a dispersion relation of light that propagates in a medium adjacent to a waveguide layer (in this case, the photonic crystal layer). The light line can be indicated by a straight line decided by w=ck/n (w: angular frequency, c: light velocity, n: refractive index, k: wave number). In general, an area higher in frequency than the light line is an area in which light tends to leak from the photonic crystal.

Figure 2A:
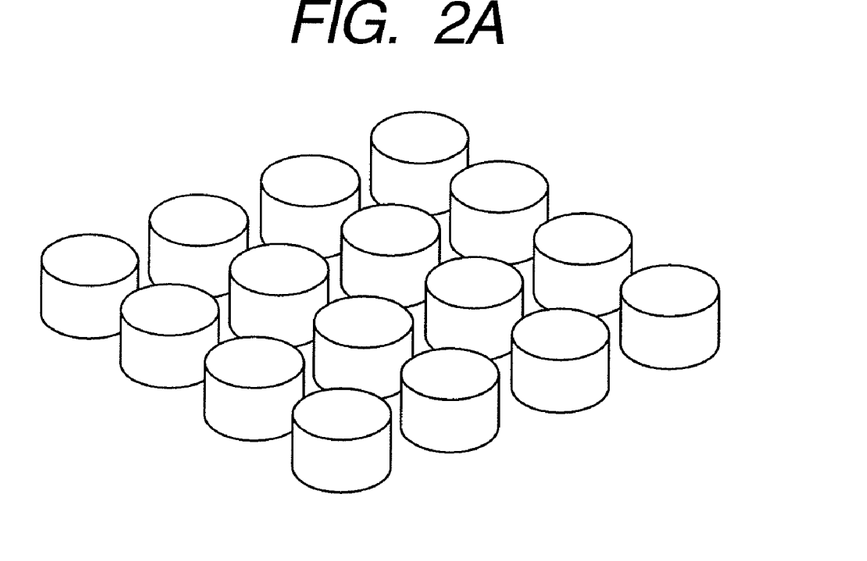
FIG. 2A is a perspective view illustrating a form of a pillar-type photonic crystal in a Non-Patent Document 1.

As described above, the mirror using the GR has an operation principle different from that of a mirror using the photonic band gap. Non-Patent Document Appl. Phys. Lett. 87, 091102 (2005) describes an examination concerning GR performed by using a photonic crystal. When a wavelength of light made vertically incident on the photonic crystal illustrated in FIG. 2A of the document is adjusted to a wavelength at which reflectance is extremely increased by the GR, the incident light is reflected at high reflectance.

Figure 2B:
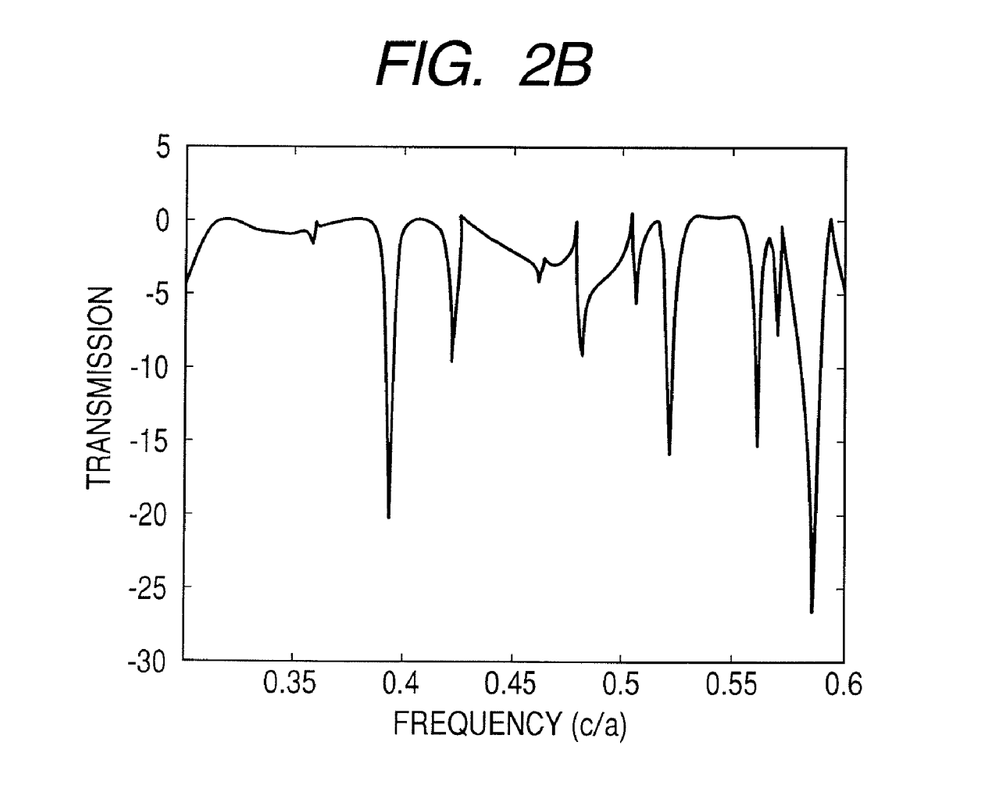
FIG. 2B is a diagram illustrating a transmittance spectrum of the pillar-type photonic crystal.

In the Non-Patent Document, a simulation is performed with a radius r of pillars circular in section set to 0.4a ("a" is a period of a grating), height h set to 0.9a, a refractive index $n_{phc}$ of a material forming the pillars set to 4.47, and a refractive index of an area adjacent to the pillars set to 1.0. As a result, GR illustrated in FIG. 2B occurs.

When a mirror applied to a laser and the like is manufactured using the GR in the photonic crystal, a refractive index difference between a photonic crystal layer and a cladding layer adjacent thereto may have to be extremely small. For example, in a surface-emitting laser having a wavelength of 670 nm, it is assumed that the photonic crystal layer is formed of $Al_{0.5}Ga_{0.5}As$ and the cladding layer adjacent thereto is formed of $Al_{0.93}Ga_{0.07}As$ or the like. In this case, refractive indexes of $Al_{0.5}Ga_{0.5}As$ and $Al_{0.93}Ga_{0.07}As$ with respect to light having a wavelength of 670 nm are 3.446 and 3.130, respectively. Thus, a relative refractive index difference $\Delta n(=(n_{phc}-n_{clad})/n_{phc})$ between both the light is about 0.09 (about 9%).

In such a case, it is anticipated that, if the structure described in the Non-Patent Document is directly applied, the GR hardly occurs and it is difficult to use the photonic crystal as a mirror.

Figure 3A:
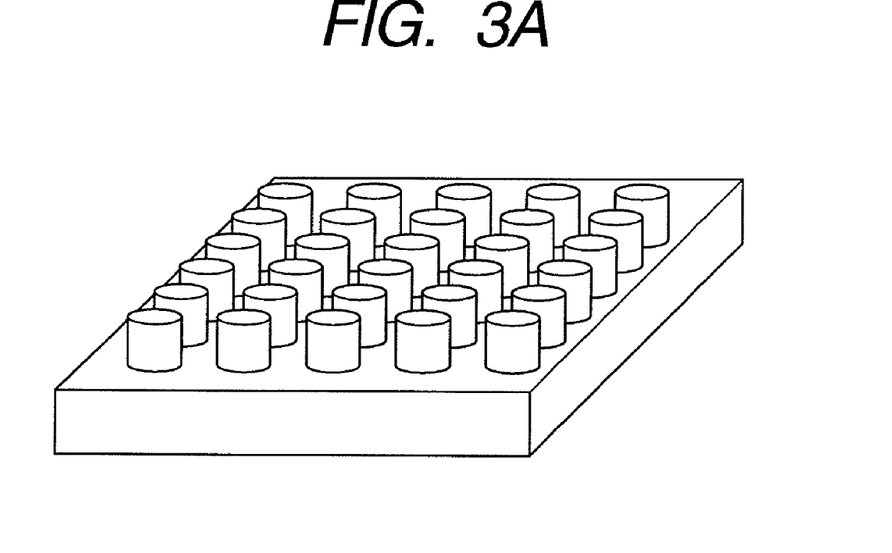
FIG. 3A is a diagram illustrating a simulation structure used for examination of the pillar-type photonic crystal in the Non-Patent Document 1 provided with a substrate.
Figure 3B:
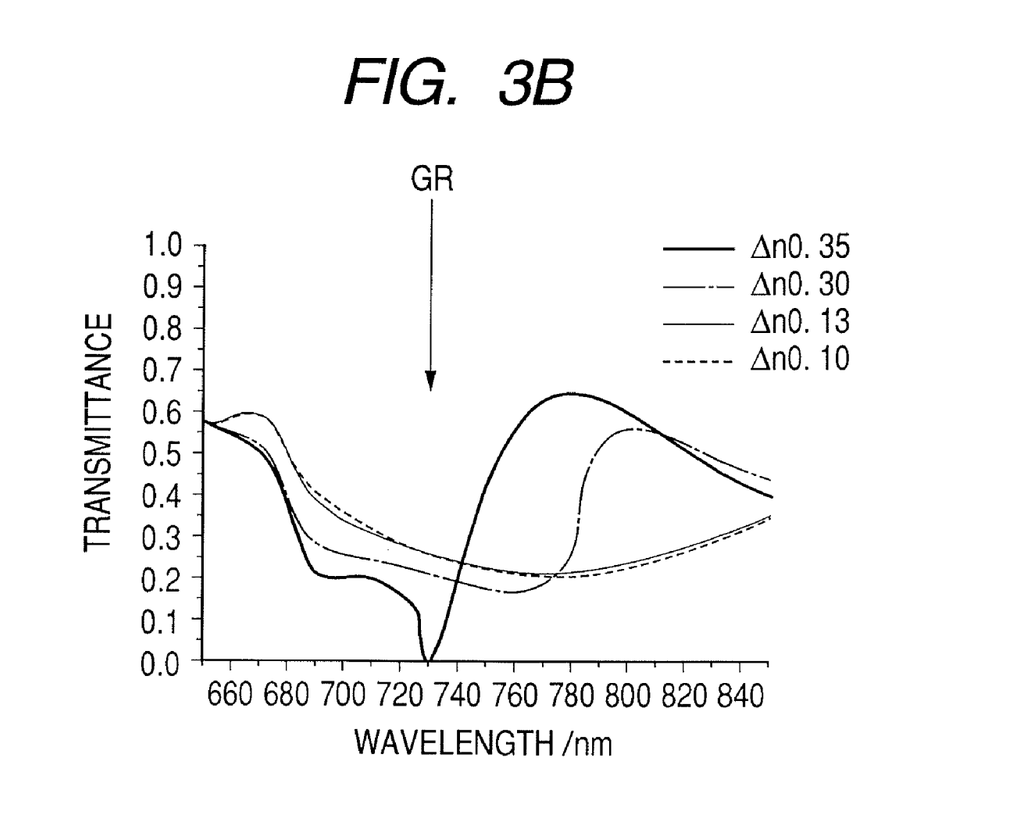
FIG. 3B is a diagram illustrating a simulation result.

Therefore, the inventors performed a simulation using the structure illustrated in FIG. 3A in the same manner and checked whether the GR could be present. The inventor confirmed that the GR could occur when a relative refractive index difference $\Delta n(=(n_{phc}-n_{clad})/n_{phc})$ between a photonic crystal layer including pillars and a substrate functioning as a cladding layer adjacent thereto is not less than 0.35 (35%) but the GR hardly occurs when the relative refractive index difference does not exceed 0.13 (13%). An actual simulation result is illustrated in FIG. 3B.

SUMMARY OF THE INVENTION

The present invention is directed to a structure having a photonic crystal, comprising: a photonic crystal layer comprised of a flat first member and plural pillars arrayed periodically in two dimensions on the first member and formed of a first material having a first refractive index $n_1$, and a low refractive index layer adjacent to the photonic crystal layer and formed of a second material having a second refractive index $n_2$ lower than the first refractive index, a relative refractive index difference between the first refractive index and the second refractive index $\Delta n(=(n_1-n_2)/n_1)$ being not less than 0.04 and not exceeding 0.13, and a height h of the pillars being not less than 0.10t and not exceeding 0.70t wherein t is a thickness of the photonic crystal layer.

The first refractive index $n_1$ can be not less than 2.15 and does not have to exceed 3.50, and the second refractive index $n_2$ is not less than 1.90 and does not have to exceed 3.30.

The first material can be comprised of a material selected from the group consisting of $TiO_2$, GaN, $In_xGa_{1-x}N$, $Al_xGa_{1-x}As$ and $(Al_xGa_{1-x})_yIn_{1-y}P$, and the second material can be comprised of a material selected from the group consisting of $Al_xGa_{1-x}N$, $Al_xGa_{1-x}As$ and indium tin oxides.

The present invention is directed to a surface-emitting laser comprising: a first mirror comprised of the above structure, an active layer and a second mirror.

The second mirror can be comprised of the above structure or a distributed Bragg reflector.

Further features of the present invention will become apparent from the following description of exemplary embodiments with reference to the attached drawings.

It is an object of the present invention to provide a new structure that can display a reflection function using the GR even when a refractive index difference between a photonic crystal layer and a cladding layer adjacent thereto is not sufficient and a surface-emitting laser using the structure.

DESCRIPTION OF THE EMBODIMENTS

First Embodiment

A structure used as a mirror according to a first embodiment of the present invention is described with reference to FIGS. 1A and 1B.

A photonic crystal layer 1000 includes a first member 1015 of a flat shape and plural columnar structures (hereinafter referred to as "pillars") 1010 periodically in two dimensions, i.e., periodically arrayed in an in-plane direction on the first member 1015. The pillars 1010 and the first member 1015 are made of the same first material having a first refractive index $n_1$. In the figures, the height of the pillars 1010 is indicated by h and the thickness of the photonic crystal layer 1000 is indicated by t.

A low refractive index layer 1020 (which may be called as a cladding layer) made of a second material having a second refractive index ($n_2$) lower than the first refractive index is provided adjacent to the first member 1015.

The mirror according to this embodiment is designed to reflect incident light in a thickness direction of the photonic crystal layer 1000, i.e., in a direction perpendicular to an in-plane of the first member and cause GR with respect to a wavelength of the incident light. In such a case, the incident light on the photonic crystal layer 1000 is diffracted and once propagated in the photonic crystal layer 1000. The propagated light is combined with a radiation mode and radiated to the outside. When the propagated and radiated light interferes with light reflected without being propagated in the photonic crystal, the structure functions as a mirror. A refractive index difference $\Delta n (=(n_1-n_2)/n_1)$ between the first refractive index and the second refractive index is not less than 0.04 and does not exceed 0.13. Since the refractive index difference $\Delta n$ cannot be zero, a realistic lower limit value thereof is 0.04 from a viewpoint of constituting an actual device.

In a photonic crystal using pillars, it is preferable that, as a sectional diameter of the pillars is increased, a refractive index difference between the photonic crystal and a low refractive index layer below the photonic crystal can be increased.

A relation of the height h of the pillars to the thickness t of the photonic crystal layer is described. A table below indicates whether a GR effect can be confirmed when t=1.2a and the refractive index difference is 0.10. In the table, "Confirmed" means that the GR effect can be confirmed and "Not confirmed" means that the GR effect cannot be confirmed.

TABLE 1

| | Height h | | | | | |
|---|---|---|---|---|---|---|
| | 0 | 0.10t | 0.20t | 0.30t | 0.40t | 0.50t |
| GR | Not confirmed | Confirmed | Confirmed | Confirmed | Confirmed | Confirmed |

| | Height h | | | | |
|---|---|---|---|---|---|
| | 0.60t | 0.70t | 0.80t | 0.90t | 1.00t |
| GR | Confirmed | Confirmed | Not confirmed | Not confirmed | Not confirmed |

As it is seen from the table, a GR phenomenon occurs when the height h of the pillars is in a range of 0.10t to 0.70t. The thickness smaller than 0.10t is not preferable because diffractive efficiency falls according to a decrease in the amplitude of a refractive index period and, therefore, the GR phenomenon hardly occurs. When the height h exceeds 0.70t, in some cases, an effective refractive index of the photonic crystal layer falls, the refractive index difference between the photonic crystal layer and the low refractive index layer decreases, and the GR phenomenon hardly occurs. From such a viewpoint, it is preferable that the range of h is set in the range described above.

The first member and the second member forming the structure as the mirror according to this embodiment are described.

The first refractive index $n_1$ is in a range of, for example, 2.15 to 3.50. As a specific material, it is possible to selectively use high refractive index dielectrics such as $TiO_2$ and semiconductors such as GaN, $In_xGa_{1-x}N$, $Al_xGa_{1-x}As$, and $(Al_xGa_{1-x})_yIn_{1-y}P$.

The second refractive index $n_2$ is in a range of, for example, 1.90 to 3.30. As a specific material, it is possible to selectively use semiconductors such as $Al_xGa_{1-x}N$ and $Al_xGa_{1-x}As$ and transparent conductive materials such as ITO (Indium Tin Oxide).

To set the refractive index difference $\Delta n$ not to exceed 0.13, for example, the first member is formed of $Al_{0.5}Ga_{0.5}As$ and the second member is formed of $Al_{0.93}Ga_{0.07}As$. A sectional shape of the pillars is circular, square, and the like. A grating is a square grating or a triangular grating. When a grating constant is "a", the thickness t of the photonic crystal layer is preferably in a range of "a" to "2.0a".

Second Embodiment

A vertical cavity surface-emitting laser (VCSEL) using the structure described in the first embodiment is described as a second embodiment of the present invention.

Figure 4:
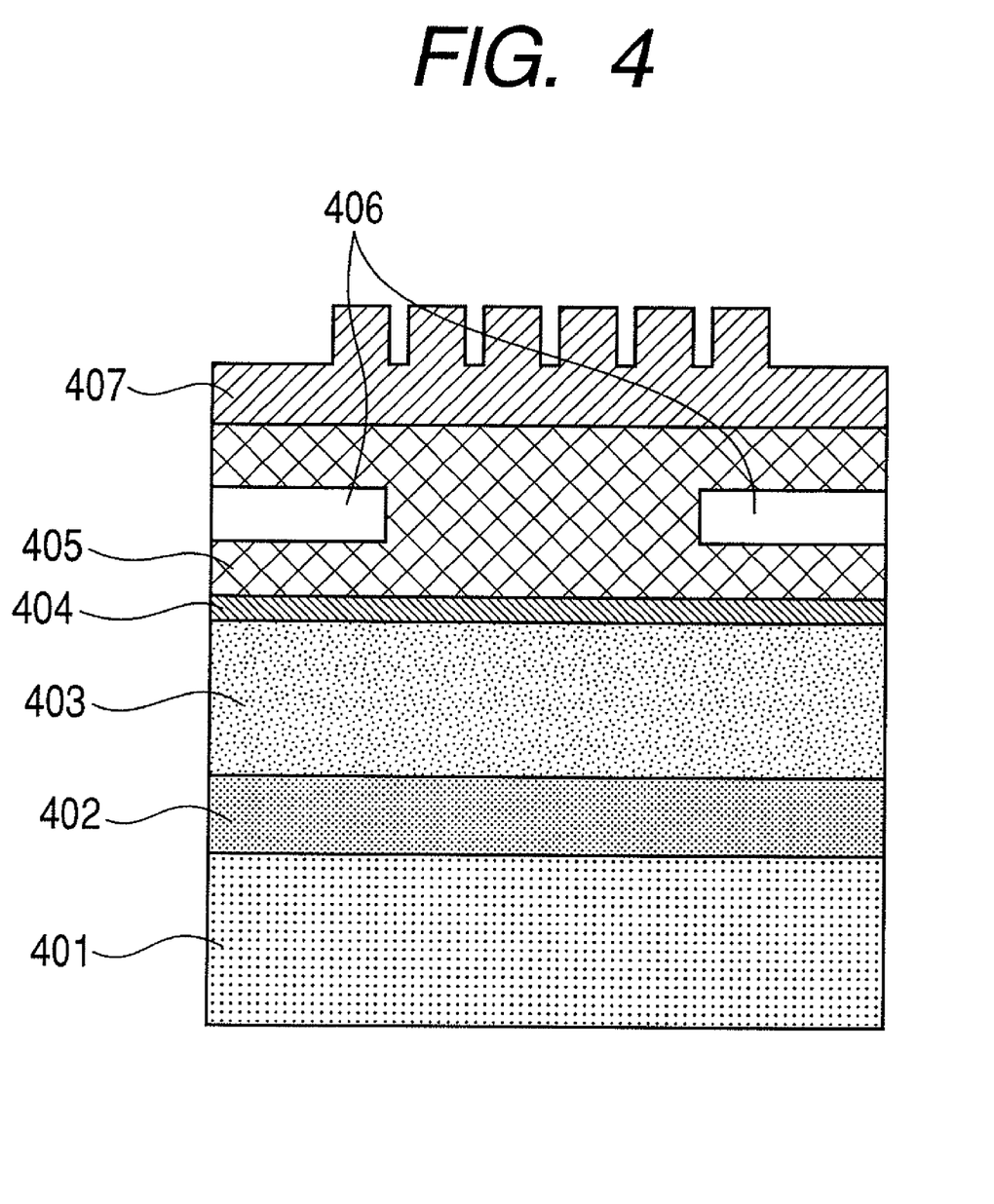
FIG. 4 is a schematic sectional view for describing the structure of a vertical cavity surface-emitting laser (VCSEL) according to a second embodiment of the present invention.

A schematic sectional view for describing the structure of the surface-emitting laser (VCSEL) according to this embodiment is illustrated in FIG. 4.

In FIG. 4, the VCSEL includes a substrate 401, a lower resonator mirror (a second mirror) 402, a lower cladding layer 403, an active layer 404, an upper cladding layer 405, a current constricting structure 406, and an upper resonator mirror (a first mirror) 407.

In the VCSEL according to this embodiment, one or both of the mirrors constituting the resonator are constituted using a structure having a photonic crystal.

Regardless of whether one or both of the mirrors are constituted using the structure having the photonic crystal, when the lower resonator mirror in FIG. 4 is constituted using the photonic crystal, it is necessary to use wafer fusion technique in a process, for example.

Therefore, in terms of difficulty in the process, it is preferable to use the photonic crystal in only one of the mirrors, the upper resonator mirror. In FIG. 4, for convenience of illustration, such a structure is illustrated.

As the other mirror other than the structure having the photonic crystal, for example, a distributed Bragg reflector (DBR) including a semiconductor or a dielectric can be used.

When the photonic crystal is used in the upper resonator mirror, as described above, there is a case that a refractive index difference between the photonic crystal layer and the upper cladding layer may have to be reduced.

In this case, a refractive index of the upper cladding layer is smaller than that of the photonic crystal layer. When the mirror in the first embodiment is used, a range of a possible refractive index difference is as described above.

When the application of the mirror as a mirror of the VCSEL is taken into account, a wider reflection band of the structure having the photonic crystal is preferable.

The mirror in the first embodiment tends to have a wider reflection band (in term of a full width at half maximum (FWHM) of the GR as a radius of the pillars is larger in a range in which the pillars are not in contact with one another.

Therefore, when the mirror is used in the VCSEL, it is preferable that the radius of the pillars is as large as possible in the range in which the pillars are not in contact with one another.

In the case of such a situation, since it is possible to secure a large effective refractive index of the photonic crystal, this is also preferable to cause the GR to develop at a low refractive index difference. Consequently, the VCSEL according to this embodiment using the mirror in the first embodiment simultaneously has two advantages, i.e., the low refractive index difference of the mirror and the cladding and the wide band of the mirror.

A laser resonator in the VCSEL according to this embodiment is described.

A resonator length L satisfies a relation of L=mλ/2 (m: integer) with respect to a resonance length λ. However, the resonator length used here is an effective resonator length including an amount of phase shift in a resonator mirror.

When an electrode (not illustrated in FIG. 4) is provided in the VCSEL according to this embodiment and driven by injection of an electric current, it is preferable to provide a current constricting structure. Possible structures include a constricting layer using oxidation constriction and a constricting layer using an increase in resistance by ion injection.

Materials that can be used in the VCSEL according to this embodiment are the structure having the photonic crystal and the material described above for the cladding layer.

Concerning the DBR, the materials described above can be used in the semiconductors. In addition to the materials described above, $SiO_2$, $HfO_2$, $ZrO_2$, and the like can be used in the dielectrics.

As the active layer 404, for example, a multiple quantum well structure and a strained quantum well structure of a semiconductor can be used.

Materials in this case are semiconductors such as $Al_xGa_{1-x}N$, GaN, $In_xGa_{1-x}N$, $Al_xGa_{1-x}As$, $(Al_xGa_{1-x})_yIn_{1-y}P$, $In_xGa_{1-x}N$, ZnSe, and ZnO according to wavelengths to be oscillated.

As the substrate 401, for example, semiconductors such as GaAs and GaN or dielectrics such as Sapphire can be used.

In this embodiment, the structure used as the mirror of the VCSEL is described. However, the structure described in the first embodiment can also be used as a diffraction grating of a DFB-type laser. In other words, it is also possible that the structure is arranged near the active layer and light made incident on the structure is resonated in the in-plane direction and extracted to the outside of the structure. The DFB-type laser is different from the VCSEL in that the lower resonator mirror is not always necessary.

Examples of the present invention are described below.

FIRST EXAMPLE

Figure 1A:
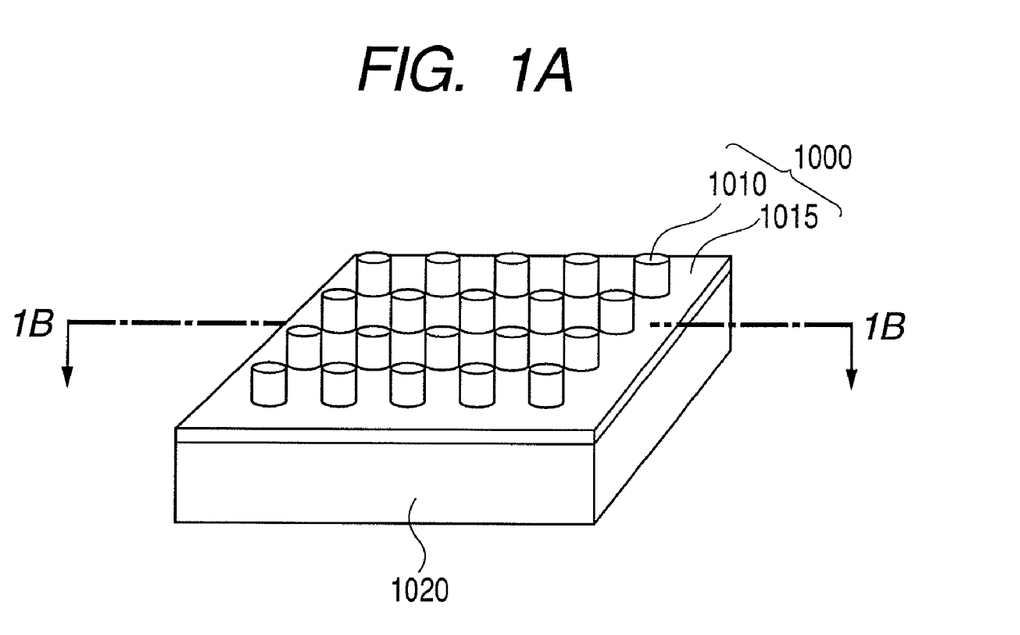
FIG. 1A is a schematic perspective view for describing a structure having a photonic crystal according to a first embodiment of the present invention.
Figure 1B:
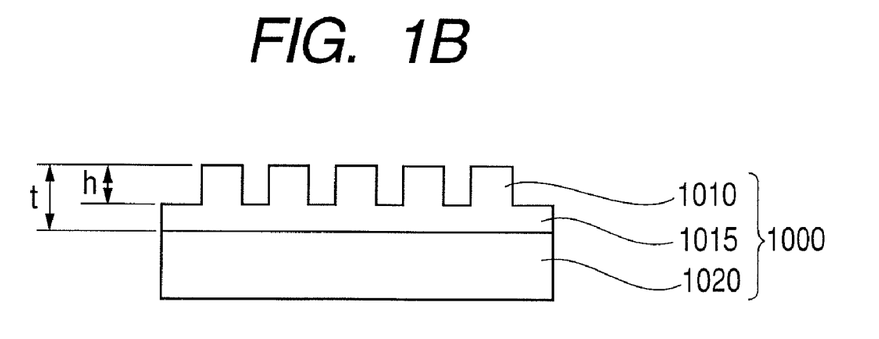
FIG. 1B is a sectional view taken along line 1B-1B in FIG. 1A.

In the first example, a GR phenomenon confirmed in a simulation using the pillar-type photonic crystal illustrated in FIGS. 1A and 1B is described.

A refractive index of the photonic crystal layer 1000 is 3.446 (a refractive index of $Al_{0.5}Ga_{0.5}As$ near the wavelength of 670 nm). A refractive index of the cladding layer 1020 is 3.130 (a refractive index of $Al_{0.93}Ga_{0.07}As$ near the wavelength of 670 nm).

As parameters of the photonic crystal, a lattice constant "a" of 210 nm, a pillar radius of 95 nm (0.45a), thickness t of 320 nm (1.53a), and pillar height h of 160 nm (0.5t) are used. A calculation is performed by using a transfer matrix method described in a document Physical Review B68, 155101 (2003).

Figure 5:
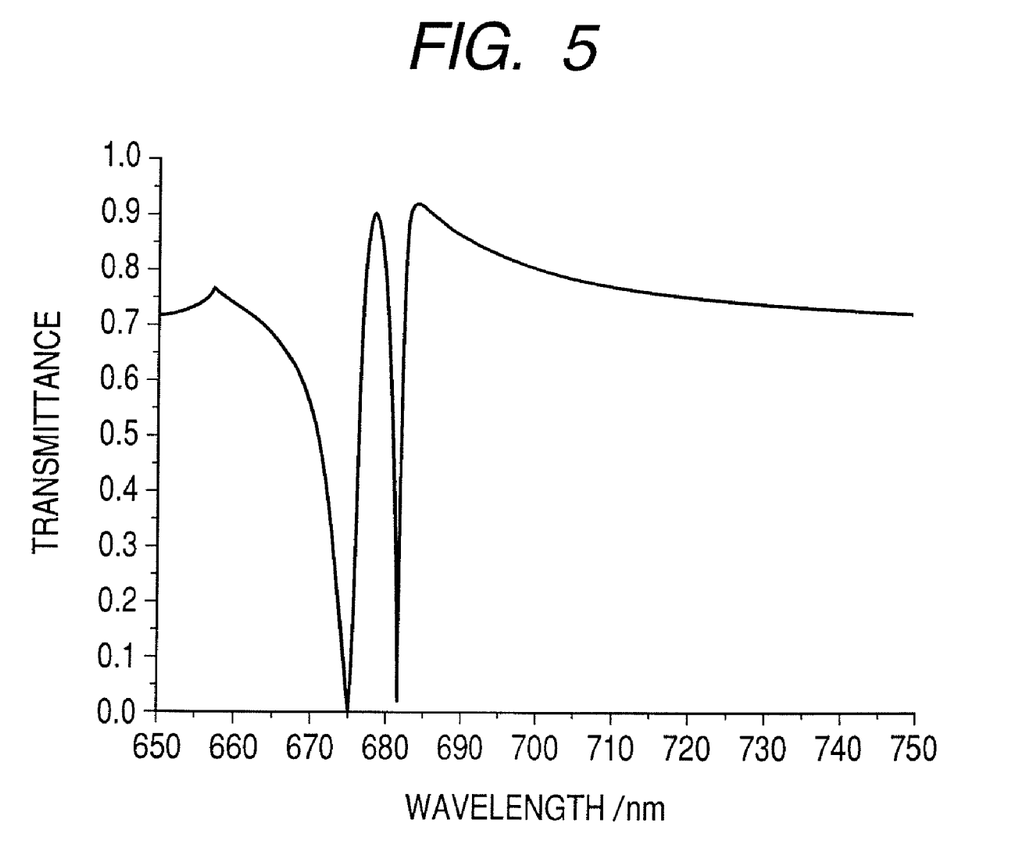
FIG. 5 is a graph illustrating a transmittance spectrum of a structure having a photonic crystal according to a first example of the present invention.

A result of the calculation is shown in FIG. 5. This is a transmission spectrum obtained when a plane wave is made incident on the structure having the photonic crystal. It is seen that the transmittance falls to 0 near the wavelength of 675 nm and the structure functions as a mirror having the reflectance of 100%. The refractive index difference Δn between the photonic crystal and the cladding in this example is about 0.09. The GR effect develops in a situation in which the refractive index difference is low.

In this example, the calculation result obtained when the parameters are fixed to constant values is described. However, as described above, it is possible to cause the GR effect to develop in a predetermined parameter range.

In this example, the refractive index difference Δn is set to 0.09. However, it is possible to cause the GR effect to develop at the maximum refractive index difference Δn up to about 0.04 using appropriate parameters such as the thickness of the photonic crystal layer and the height of the pillar.

Moreover, the thickness t of the photonic crystal slightly fluctuates because of the parameters. However, the GR effect develops if the thickness t is not less than about 0.9a.

When the thickness t is larger than 0.9a, the GR effect more easily develops as the thickness t is larger.

In this case, at an optimum value of the thickness t, a FWHM of the GR effect reaches the maximum. When the thickness t is set larger than the optimum value, the FWHM gradually decreases.

Concerning the height of the pillars, when the height is about 0.1t to 0.7t with respect to the thickness t of the photonic crystal layer, the GR effect develops. A reason for this is as described above.

Concerning the radium of the pillars, as described above, in a range in which the pillars are not in contact with one another, a band (a FWHM) of the GR effect tends to increase as the radius is larger. Moreover, in the case of such a situation, since a large effective refractive index of the photonic crystal can be secured, this is suitable for causing the GR effect to develop at a low refractive index difference.

Lastly, a material forming the mirror is described.

In this embodiment, the material is $Al_xGa_{1-x}As$ of a certain composition. However, the GR effect develops whichever material of the materials described in the first embodiment is used as long as a relation between a refractive index of a substance forming the photonic crystal layer 1000 and a refractive index of a substance forming the low refractive index layer 1020 is the same as that described in the first embodiment.

Therefore, it is possible to cause the GR effect to develop at a refractive index difference Δn of 0.13 to 0.04 using these materials.

The simulation is performed using the above transfer matrix method.

SECOND EXAMPLE

In a second example, a VCSEL constituted by applying the present invention is described.

Figure 6:
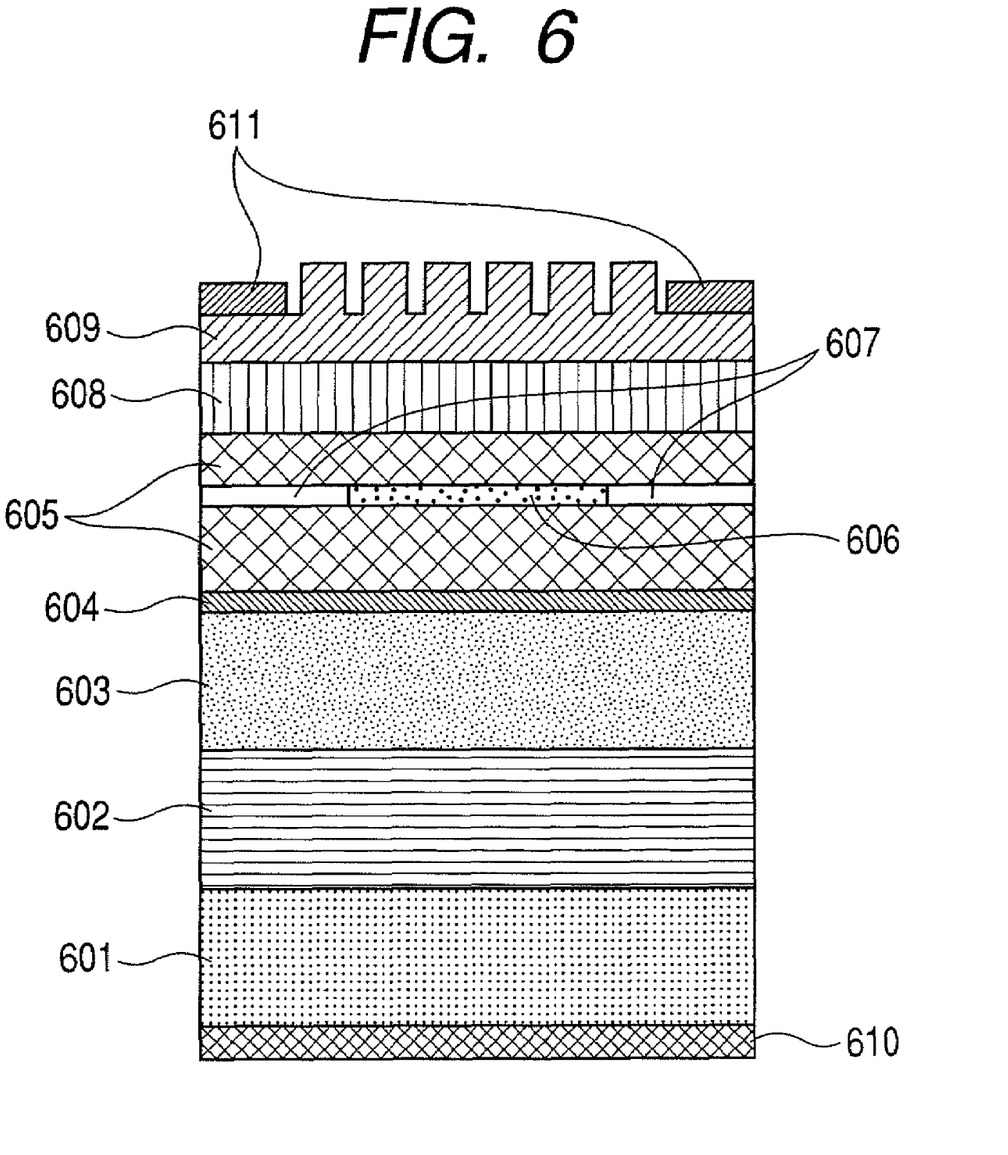
FIG. 6 is a schematic sectional view for describing a surface-emitting laser according to a second example of the present invention.

A schematic sectional view for describing the surface-emitting laser according to this example is illustrated in FIG. 6.

In FIG. 6, the VCSEL includes a substrate 601, a lower resonator mirror 602, a lower cladding layer 603, an active layer 604, and an upper cladding layer 605.

The VCSEL also includes an oxidation current constricting layer 606, a current constricting oxide layer 607, a light confinement layer for the upper resonator mirror 608, an upper resonator mirror 609, an n electrode 610, and a p electrode 611.

Functions, structures, and materials of respective sections of the VCSEL in this example are described below.

In this example, one of mirrors constituting a resonator is a structure having a photonic crystal and the other is a DBR. The resonator mirror 609 is the structure having the photonic crystal and is formed of p-$Al_{0.5}Ga_{0.5}As$.

Structural parameters are the same as those of the mirror in the first example. The mirror reflects light having the wavelength of 670 nm, which is an oscillation wavelength of the VCSEL in this example.

A size of a photonic crystal section of the mirror is 7 μmF. Pillars for about 30 periods are arranged in a circular shape.

The light confinement layer for the upper resonator mirror 608 plays a role of trapping light in the photonic crystal in the same manner as the cladding layer of the mirror in the first example.

A material of the light confinement layer for the upper resonator mirror 608 is p-$Al_{0.93}Ga_{0.07}As$ and the thickness thereof is 428 nm (equivalent to two wavelengths).

The lower resonator mirror is a DBR and formed of a pair of n-$Al_{0.5}Ga_{0.5}As$ and n-$Al_{0.93}Ga_{0.07}As$. The number of layers is 70 pairs. The thickness of each of the layers is λ/4 of an oscillation wavelength in terms of an optical path length. In this example, since the oscillation light is red light having the wavelength of 670 nm, the thicknesses of the respective layers are 48 nm and 53 nm. In the lower resonator mirror, n-$Al_{0.5}Ga_{0.5}As$ and n-$Al_{0.93}Ga_{0.07}As$ are stacked in this order from a layer closest to the lower cladding layer of the resonator.

The active layer 604 has a multiple quantum well structure including non-doped $(Al_{0.5}Ga_{0.5})_{0.5}InP$ and $In_{0.5}Ga_{0.5}P$. The number of wells is three and the thicknesses of the respective layers are 7 nm and 9 nm.

A boundary of the well and the cladding is an $(Al_{0.5}Ga_{0.5})_{0.5}InP$ layer having the thickness of 12 μm.

Each of the lower cladding layer 603 and the upper cladding layer 605 is formed of n,p-$(Al_{0.73}Ga_{0.27})_{0.5}InP$. The thickness of each of the layers is 119 nm.

A resonator of the VCSEL in this example includes lower and upper cladding layers, an active layer, and a light confinement layer for the upper resonator mirror.

As the thicknesses of the respective layers, the thickness of the lower cladding layer, the active layer, and the upper cladding layer is equivalent to 1.5 wavelengths and the thickness of the light confinement layer for the upper resonator mirror is equivalent to two wavelengths. A total thickness of these layers is equivalent to 3.5 wavelengths.

The active layer is introduced 0.75 wavelength apart from the lower resonator mirror and is located in a section of an antinode of a standing wave of resonant light.

A p-electrode is a ring electrode formed around an area in which the pillar structure of the photonic crystal of the resonator mirror is provided.

A material of the p-electrode is Au—Ge—Ni. An n-electrode is formed of Au—Zn and formed in an entire area on the rear side of the substrate.

The oxidation current constricting layer 606 and the current constricting oxide layer 607 have the thickness of 20 nm. The oxidation current constricting layer 606 has a circular shape with a diameter of 5 μmF.

The substrate 601 is formed of n-GaAs and has the thickness of 525 μm.

A manufacturing process for the VCSEL in this example is described.

The VCSEL of this example can be basically manufactured using a process used in manufacturing a VCSEL of a publicly-known AlGaInp, AlGaAs system.

Specifically, the VCSEL of this example can be manufactured in a process in which crystal growth, photolithography, dry etching, and vapor deposition/sputtering for electrode are combined.

The portion of the photonic crystal is manufactured by EB lithography and dry etching.

When electricity is supplied to the VCSEL in this embodiment, red light having the oscillation wavelength of 670 nm emits. The resonator including the structure having the photonic crystal serving as the upper resonator mirror and the DBR mirror serving as the lower resonator mirror functions as a vertical resonator of the VCSEL.

In this example, $(Al_xGa_{1-x})_yIn_{1-y}P$ is used for the active layer and the cladding and $Al_xGa_{1-x}As$ is used for the resonator mirror and the light confinement layer for the upper resonator mirror. However, other materials can also be used.

Materials that can be used are as described in the first and second embodiments.

However, a refractive index difference between the upper resonator mirror and the light confinement layer for the upper resonator mirror is 0.13 to 0.04.

According to the invention, it is possible to realize a new structure that has a reflection function using the GR even when a refractive index difference between a photonic crystal layer and a cladding layer is not sufficient.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-298525, filed Nov. 2, 2006, and 2007-240767, filed Sep. 18, 2007 which are hereby incorporated by reference herein in their entirety.

What is claimed is:

1. A structure having a photonic crystal, the structure comprising:
    a photonic crystal layer that includes a flat first member and
        plural pillars arrayed periodically in two dimensions on the first member and formed of a first material having a first refractive index $n_1$; and a low refractive index layer adjacent to the photonic crystal layer and formed of a second material having a second refractive index $n_2$ lower than the first refractive index, wherein a relative refractive index difference between the first refractive index and the second refractive index $\Delta n(=(n_1-n_2)/n_1)$ is not less than 0.04 and does not exceed 0.13, wherein a height h of the pillars is not less than 0.10 t and does not exceed 0.70 t, t being a thickness of the photonic crystal layer and t being greater than or equal to 0.9 a, and a being a lattice constant of the photonic crystal layer, and wherein a radius r of a pillar is greater than or equal to 0.45 a.

2. The structure according to claim 1, wherein the first refractive index $n_1$ is not less than 2.15 and does not exceed 3.50, and the second refractive index $n_2$ is not less than 1.90 and does not exceed 3.30.

3. The structure according to claim 1, wherein the first material includes a material selected from a group consisting of $TiO_2$, GaN, $In_xGa_{1-x}N$, $Al_xGa_{1-x}As$, and $(Al_xGa_{1-x})_yIn_{1-y}P$, and the second material includes a material selected from a group consisting of AlxGa1-xN, AlxGa1-xAs, and indium tin oxides.

4. The structure according to claim 1, wherein the structure is incorporated in a surface-emitting laser as a first mirror, and wherein the surface-emitting laser includes:

an active layer, and a second mirror.

5. The structure according to claim 4, wherein the second mirror is of a same structure as the structure of the first mirror or is a distributed Bragg reflector.

* * * * *